United States Patent
Wilson

(10) Patent No.: US 8,854,129 B2
(45) Date of Patent: Oct. 7, 2014

(54) TIMING ALIGNMENT FOR MODULATED SUPPLY

(75) Inventor: Martin Paul Wilson, Cambourne (GB)

(73) Assignee: Nujira Limited (GB)

( * ) Notice: Subject to any disclaimer, the term of this patent is extended or adjusted under 35 U.S.C. 154(b) by 171 days.

(21) Appl. No.: 13/640,873

(22) PCT Filed: Apr. 12, 2011

(86) PCT No.: PCT/EP2011/055727
§ 371 (c)(1),
(2), (4) Date: Dec. 27, 2012

(87) PCT Pub. No.: WO2011/128341
PCT Pub. Date: Oct. 20, 2011

(65) Prior Publication Data
US 2013/0200949 A1    Aug. 8, 2013

(30) Foreign Application Priority Data
Apr. 15, 2010 (GB) .................................. 1006315.4

(51) Int. Cl.
*H03G 3/20* (2006.01)
*H03F 1/02* (2006.01)
*H03G 3/00* (2006.01)

(52) U.S. Cl.
CPC .......... *H03G 3/004* (2013.01); *H03F 2200/102* (2013.01); *H03F 1/0227* (2013.01)
USPC ........................................ 330/136; 330/297

(58) Field of Classification Search
USPC .................... 330/136, 297, 285, 296
See application file for complete search history.

(56) References Cited

U.S. PATENT DOCUMENTS

| 6,025,754 | A | 2/2000 | Czora |
| 8,558,616 | B2 * | 10/2013 | Shizawa et al. ............... 330/149 |
| 8,665,017 | B2 * | 3/2014 | Onishi .......................... 330/136 |
| 2006/0028271 | A1 * | 2/2006 | Wilson .......................... 330/199 |
| 2008/0224769 | A1 | 9/2008 | Markowski et al. |

(Continued)

FOREIGN PATENT DOCUMENTS

| GB | 2455066 A | 3/2009 |
| WO | 2005041404 A1 | 5/2005 |
| WO | 2007013034 A1 | 2/2007 |

OTHER PUBLICATIONS

Great Britain Search Report, dated Aug. 13, 2010 of Great Britain Patent Application No. GB1006315.4.

(Continued)

*Primary Examiner* — Henry Choe
(74) *Attorney, Agent, or Firm* — Kaplan Breyer Schwarz & Ottesen, LLP

(57) ABSTRACT

There is disclosed a method, in an amplifier stage comprising an amplifier and a modulated supply, the amplifier being arranged to amplify an input signal and the modulated supply being arranged to generate a supply voltage for the amplifier by tracking an envelope of the signal to be amplified, the method comprising: comparing the relative timing of a signal representing the current drawn by the amplifier from the modulated supply and a signal representing the voltage generated at the output of the modulated supply; and in dependence upon a difference in the relative timing, adjusting the timing of either the input signal to be amplified or the generated supply voltage to reduce the difference in the relative timing.

20 Claims, 4 Drawing Sheets

(56) References Cited

U.S. PATENT DOCUMENTS

2008/0242246 A1    10/2008  Minnis et al.
2009/0097591 A1     4/2009  Kim
2009/0215413 A1     8/2009  Ahn et al.
2014/0028392 A1*    1/2014  Wimpenny .................. 330/149

OTHER PUBLICATIONS

International Search Report and Written Opinion, dated Jun. 27, 2011 of International Application No. PCT/EP2011/055727.

* cited by examiner

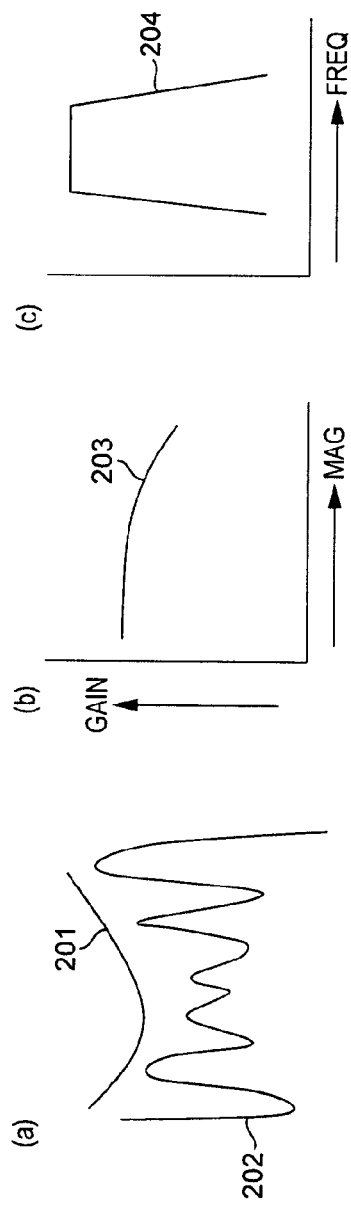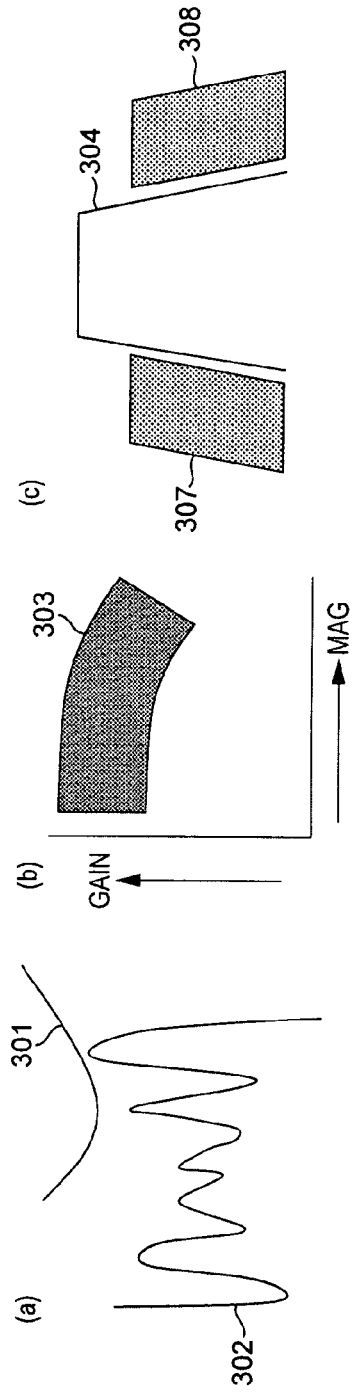

TIMING ALIGNMENT FOR MODULATED SUPPLY

BACKGROUND TO THE INVENTION

1. Field of the Invention

The present invention relates to the provision of a modulated power supply for an amplifier, and particularly but not exclusively to an efficient envelope-tracking modulated power supply delivered to a radio frequency amplifier.

2. Description of the Related Art

It is well-known in the art that the efficiency of radio frequency (RF) power amplifiers can be improved by implementation of envelope tracking techniques. FIG. 1(a) shows a known efficient envelope tracking implementation, generally denoted by reference numeral 100, a detailed description of which can be found in British Patent No. 2398648 in the name of Nujira Limited. A modulated RF input signal on a line 120 is generated from a complex baseband signal provided by a baseband functional block (or baseband system) 102. The modulated RF input signal on line 120 provides an input for an RF power amplifier 106. As illustrated in FIG. 1, and discussed further hereinbelow, the RF input signal on line 120 suffers a path delay as represented by delay stage 107, such that a delayed version of the modulated RF input signal on a line 122, at the output of the delay stage, forms the input to the amplifier 106. The modulated RF input signal on line 122 is amplified by the RF power amplifier 106 to provide an output RF signal on line 130. The amplification of the RF signal provides a signal at a suitable level for driving an RF transmitter antenna 118 connected to the output of the RF power amplifier 106.

The output of the baseband system 102 is also provided as an input to pre-processing circuitry 101. The pre-processing circuitry 101 provides a signal on line 125 as an input to a modulated power supply stage 116, which in accordance with the technique such as described in UK Patent No. 2398648 generates a modulated power supply on line 126 for delivery to the power supply input of the RF power amplifier 106. Preferably the modulated power supply stage 116 includes a coarse signal path 117 for generating a coarse voltage approximation of the desired power supply voltage, and a correction signal path 119 for generating a correction voltage to be combined, in a combiner 121, with the coarse voltage to generate a modulated supply voltage for the amplifier 106 on line 126.

As denoted in FIG. 1(b), the pre-processing circuitry 101 may include a number of functional blocks. An envelope signal is extracted by an envelope detector 108 from the modulated RF signal on line 120 at the output of the baseband system 102. The envelope detector 108 is a suitable means adapted for obtaining the magnitude of a complex signal. The extracted envelope signal is provided from the envelope detector 108 and is applied to a shaping table 110, which may be a look-up table or a non-linear function. The output of the shaping table 110 is provided as an input to a digital-to-analogue converter 112 for conversion from a digital to an analogue signal. The analogue signal is then provided as an input to a filter stage 114 comprising a reconstruction filter. A shaped, filtered signal based on the extracted envelope is then generated on line 125, at the output of the filter 114, and forms the input to the modulated supply 116.

As illustrated in FIG. 1(a), each stage 108 to 114 of the pre-processing circuitry 101 adds a delay, particularly the reconstruction filter 114. There is an overall delay of the pre-processing circuitry denoted as $T_1$, illustrated in FIG. 1(a).

As also illustrated in FIG. 1(a), and mentioned hereinabove, there is a path delay, denoted by block 107, in the path from the baseband system 102 to the input to the RF amplifier 106 on line 122. This is denoted as $T_2$, illustrated in FIG. 1(a).

The modulated supply 116 also introduces a delay, denoted as $T_3$, illustrated in FIG. 1(a).

Thus overall there is a path delay of $T_2$ between the output of the baseband system 102 and the input to the amplifier 106 on line 122; and a path delay of $T_1+T_3$ between the output of the baseband system 102 and the input to the supply terminal of the amplifier 106 on line 126.

The timing delay $T_3$ introduced by the modulated supply can be reliably estimated and compensated for. However the timing delays $T_1$ and $T_2$ cannot be reliably estimated, and therefore cannot be reliably compensated for. The difference between the pre-processing delay $T_1$ and the path delay $T_2$ cause a timing mis-alignment—or timing error—between the RF input signal on line 130 at the output of the RF power amplifier, and the modulated power supply voltage on line 126 provided to the RF power amplifier, which is intended to be tracking the RF input signal on line 122. In practice the RF output signal on line 130 and the supply voltage on line 126 are connected at a common node, and the tracking supply voltage must be time-aligned to the generated output voltage on line 130 as best as possible to maximise efficiencies.

The effect of this timing mis-alignment can be understood with reference to FIGS. 2 and 3.

With reference to FIG. 2a, there is illustrated an RF signal designated by reference numeral 202, and an envelope signal extracted therefrom designated by reference numeral 201. In the example of FIG. 2a, the envelope signal is well-aligned with the RF signal. As illustrated in FIG. 2b, this good alignment means that for every instantaneous level on the RF envelope there is a unique gain value, as represented by the curve denoted by reference numeral 203. The same applies to the phase shift, but this is not shown in the figures. When the gain curve is corrected by a suitable simple one-dimensional means, the resulting transmitted spectrum, as denoted by reference numeral 204 in FIG. 2c, is well-controlled.

With reference to FIG. 3a, there is illustrated a scenario where timing mis-alignment occurs between the RF signal and the envelope signal. The RF signal is generally denoted by reference numeral 302, and the corresponding extracted envelope is generally denoted by reference numeral 301. Comparing FIGS. 3a and 2a, it can be seen that in FIG. 3a there is a significant mis-alignment between the RF signal 302 and the envelope signal 301 in FIG. 3a. As illustrated in FIG. 3b a gain curve denoted by reference numeral 303 thus results, which no longer has a unique gain value corresponding to every RF level. If a simple correction means is used, the result is asymmetric and as illustrated in FIG. 3c unwanted sidebands denoted by reference numerals 307 and 308 are generated in addition to the desired spectrum 304, which can potentially interfere with other functions or processes that are occurring in adjacent channels at the same time.

The timing problem occurs purely because of delay. Component tolerances are one cause of delay and result in spreads of delay.

This timing problem is addressed in the prior art by providing means for rectifying the mis-aligned signals of FIG. 3a to be aligned, as best as possible, in accordance with the ideal scenario of FIG. 2a.

It is known in the art to provide a delay stage, for example in the input path to the amplifier input on line 122 in FIG. 1(a) (not the path delay 107), in order to mitigate for the delay caused in the pre-processing stage 101 as described with reference to FIGS. 3a to 3c. This assumes that the delay caused in the pre-processing stage 101 is greater than that caused by the path delays represented by block 107 in FIG. 1(a). The aim is for the delay stage to re-align the signals as best as possible. Such a delay stage is intended to delay the input signal on line 122 to the RF amplifier on line 122, to attempt to achieve alignment between the modulated supply signal on line 126 (which has been unavoidably delayed by the pre-processing stage 101) and the output signal on line 130.

As noted above, a complication arises in that component tolerances as a result of manufacturing techniques result in spreads of delay. Therefore the delay may not be fixed, and ideally some means for adjusting delay is required, to compensate for production tolerances and temperature, as well as expected delays due to the operation of the circuitry in the pre-processing path. There are techniques known in the art to provide adjustable delays. However there are problems associated with these techniques. In particular there is a requirement to provide a means for measuring the value of the mis-alignment, in order to compensate for the mis-alignment, and achieving this measurement can be complex.

Known methods include detecting the RF output signal from the RF amplifier, i.e. the signal on line 130, and demodulating it at baseband or RF, and then looking for loops in the amplitude-modulation (AM) and phase-modulation (PM) correlation plots. However at baseband this adds considerable complexity, and would therefore not be suitable for implementation in, for example, mobile equipment such as mobile telephone-equipped handsets.

In an alternative known method the RF signals may be demodulated at RF. However with multiple-band equipment, such as multiple-band telephony-equipped mobile equipment, this would complicate the transceiver architecture.

When the envelope signal is a shaped version of the RF magnitude signal rather than the actual RF magnitude signal, a problem arises in using the RF signal to determine timing alignment measurement. In a modulator arrangement that processes the envelope in the digital domain, there may be no access to the unshaped RF magnitude signal. Using cross-correlation with a shaped envelope signal would result in maxima when the signals are time aligned, but these maxima are not sensitive to small timing errors, and there is no direction information.

It is therefore an aim of the present invention to provide a technique which addresses one or more of the above problems. In particular it is an aim of the invention to provide a technique for efficiently measuring or determining the timing misalignment between an RF signal to be amplified and an envelope-tracking modulated power supply signal to be delivered to the amplification stage, to allow for compensation for such misalignment.

SUMMARY OF THE INVENTION

In accordance with the invention there is provided a method, in an amplifier stage comprising an amplifier and a modulated supply, the amplifier being arranged to amplify an input signal and the modulated supply being arranged to generate a supply voltage for the amplifier by tracking an envelope of the signal to be amplified, the method comprising: comparing the relative timing of a signal representing the current drawn by the amplifier from the modulated supply and a signal representing the voltage generated at the output of the modulated supply; and in dependence upon a difference in the relative timing, adjusting the timing of either the input signal to be amplified or the generated supply voltage to reduce the difference in the relative timing.

The amplifier stage is preferably an RF amplifier stage, and thus a misalignment is reduced without the need to demodulate RF signals. The signals used to determine a timing misalignment between RF signals are not RF signals themselves, but represent the timing of the RF signals.

The method may further comprise the step of deriving the signal representing the current drawn by the amplifier from the modulated supply stage from the current signal at the output of the modulated supply.

The modulated supply may comprise a coarse path for generating a coarse representation of the supply voltage and a correction path for generating a correction voltage to be applied to the coarse representation for generation of the supply voltage, the method further comprising the step of deriving the signal representing the current drawn by the amplifier from the current signal in the coarse path and current signal in the correction path, and combining such current signals.

The method may further comprise the step of deriving the signal representing the voltage at the output of the modulated supply stage from the voltage at the output of the modulated supply.

The method may further comprise the step of deriving the signal representing the voltage at the output of the modulated supply stage from the voltage at the input of the modulated supply. The step of comparing the relative timing difference further may include the step of adjusting the timing of the signal representing the voltage at the input of the modulated supply to compensate for timing delays with the modulated supply.

The step of adjusting the timing may comprise applying a delay in the RF input path to the amplifier. The step of adjusting the timing may comprise applying a delay in the RF supply path to the amplifier.

The invention also provides an amplifier stage comprising an amplifier and a modulated supply, the amplifier being arranged to amplify an input signal and the modulated supply being arranged to generate a supply voltage for the amplifier by tracking an envelope of the input signal, the amplifier stage further comprising: a comparator for comparing the relative timing of a signal representing the current drawn by the amplifier from the modulated supply and a signal representing the voltage generated at the output of the modulated supply; and a delay stage, operable in dependence upon a difference in the relative timing, for adjusting the timing of either the input signal to be amplified or the generated supply voltage, to reduce the difference in the relative timing.

The amplifier stage may further comprise: a first differentiator for receiving as an input the signal representing the voltage at the output of the modulated supply and for generating a differentiated version thereof as an output; a second differentiator for receiving as an input the signal representing the current drawn by the amplifier and for generating a differentiated version thereof as an output; a first zero-crossing comparator for receiving as an input the output of the first differentiator and for generating an output; a second zero-crossing comparator for receiving as an input the output of the second differentiator and for generating an output; a register for receiving as first and second inputs the outputs of the first and second comparators, wherein the first and second comparators set or reset an output of the register, such that the register output indicated which if the two inputs leads or lags the other; and an integrator for receiving as an input the output of the register and for averaging the output of the register, to provide at an output thereof a signal indicative of direction of a misalignment between the voltage eat the output of the modulated supply and the current drawn by the modulated supply.

The amplifier stage may further comprise: a differentiator for receiving as an input one of the signal representing the current drawn by the modulated supply or the signal representing the output voltage, and for generating a differentiated version thereof as an output; a comparator for receiving the output of the differentiator, for extracting a sign of the differentiated signal; a saturating single linear input multiplier for receiving at a switching port thereof the sign at the output of the comparator; a switch for selectively connecting either the signal representing the current drawn by the modulated supply or the signal representing the output voltage to a linear input of the multiplier; a controller for controlling the switch such that: in a calibration phase the one of the signal representing the current drawn by the modulated supply or the signal representing the output voltage connected to the differentiator is connected to the linear input, to provide a dc offset value for a calibration block of the multiplier; and in a measurement phase the one of the signal representing the current drawn by the modulated supply or the signal representing the output voltage not connected to the differentiator is connected to the linear input, further wherein in the measurement stage the multiplier multiplies the sign from the output of the comparator with the signal at the linear input, and removes the dc offset; and a low pass filter for receiving the output of the multiplier and for generating a signal indicative of the magnitude and direction of a misalignment between the voltage at the output of the modulated supply and the current drawn by the modulated supply.

BRIEF DESCRIPTION OF THE FIGURES

The invention will now be described by way of example with reference to the accompanying figures, in which:

FIGS. 2a to 2c illustrate an exemplary operation when timing alignment is achieved;

FIGS. 3a to 3c illustrate the deficiencies which arise when timing mis-alignment occurs;

DESCRIPTION OF THE PREFERRED EMBODIMENTS

Figure 1A:
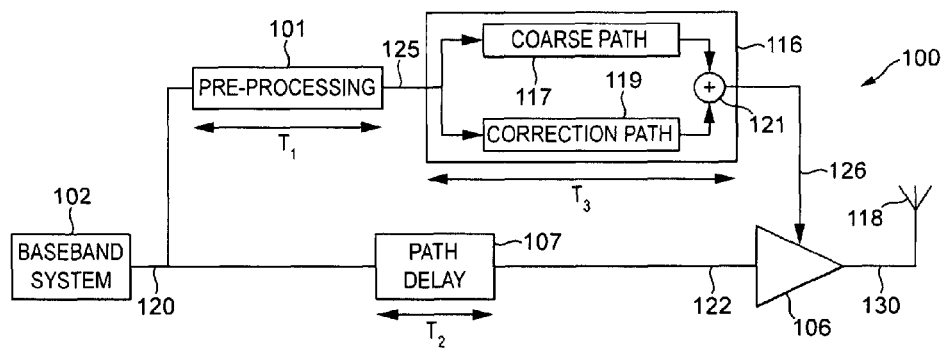
FIGS. 1(a) and 1(b) illustrate block diagrams of a known RF amplification stage including an envelope-tracking modulated power supply.

The invention is described herein by way of particular examples and specifically with reference to preferred embodiments. It will be understood by one skilled in the art that the invention is not limited to the details of the specific embodiments given herein. In particular the invention is described herein by way of reference to an RF amplification stage. However more generally the invention may apply to any arrangement where it is necessary to time-align two signals. The invention as described herein is particularly advantageous when applied to an RF amplification stage of a portable device, such as a portable device including telephony functionality.

The present invention provides for the determination of the timing misalignment between the input signal path and the supply modulation path, which result in a misalignment between the input signal to be amplified and the instantaneous voltage supply, without the need to demodulate RF signals. This is achieved by utilising signals in the RF amplification stage which are not RF signals, but which provide the necessary timing information.

It is necessary to obtain a representation of the timing of the supply voltage signal at the input to the RF amplifier, and to obtain a representation of the timing of the RF output signal at the output of the RF amplifier. The supply voltage is connected in the amplifier at a node which is common to the output of the RF amplifier, and the invention—and its embodiments—seeks to align these two signals.

In order to obtain a representation of the timing of the RF output signal from the amplifier, the invention—and its embodiments—utilises the timing information of the current signal drawn by the amplifier from the modulated supply on line 126.

This information can be obtained by analysing the current at the output of the modulated supply on line 126, or by analysing the current drawn in each of the coarse and correction paths in the modulated supply itself, and then combining them.

In order to obtain a representation of the timing of the voltage supply signal to the amplifier, the invention—and its embodiments—utilises the timing information of the voltage signal formed by the modulated supply at the supply input of the amplifier on line 126.

This information can be obtained by obtaining the timing information of the voltage signal at the output of the modulated supply on line 126, or by obtaining the timing information of the voltage signal on line 125 at the input to the modulated supply and then adjusting it by the known timing delay $T_3$ associated with the modulated supply.

The output of the modulated supply is not an RF signal, but may have RF information superimposed on it. For this reason, analysing the signal at the input to the modulated supply may be preferable, to avoid any RF signals in the processing.

Thus the invention—and its embodiments—extracts timing information relating to the supply voltage delivered to the amplifier and the output signal of the amplifier without the need to demodulate any RF signals. With respect to the RF output signal, the invention effectively exploits the demodulation effect of the RF amplifier itself by analysing the current drawn by the amplifier from the modulated supply.

The various current and voltage values may be obtained in a variety of different ways, as one skilled in the art will appreciate. In the following there is discussed embodiments describing examples of ways in which the signal information may be obtained. These embodiments are illustrative, and do not limit the scope of the invention.

It should also be noted that it is not necessary to determine the absolute timing of any signal representing the above information. The invention requires a relative delay between two signals to be determined. Therefore it is sufficient to identify signals representing the desired information, and compare them in order to determine relative information, without the need to determine absolute timings or otherwise specifically measure the signals.

Figure 4:
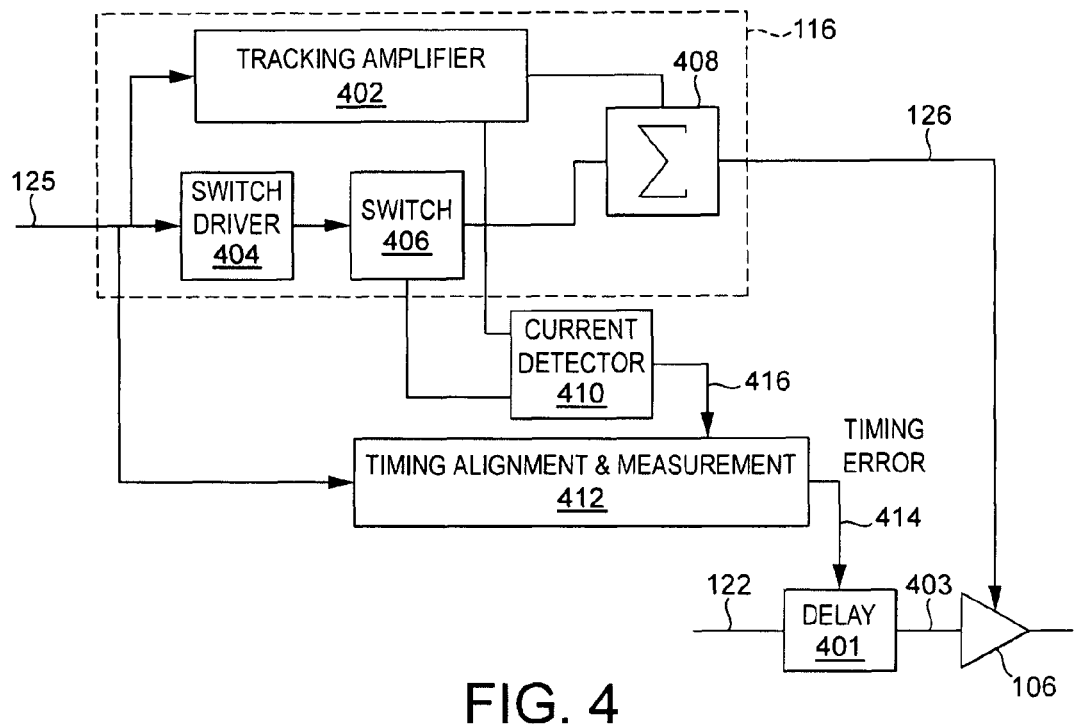
FIG. 4 illustrates an RF amplification stage including an envelope-tracking modulated supply stage including timing alignment measurement functionality in accordance with an embodiment of the invention.

With reference to FIG. 4, there is illustrated the introduction of timing alignment measurement functionality, in accordance with an embodiment of the invention, into an exemplary envelope-tracking modulated power supply arrangement for delivering a power supply to an RF amplification stage.

Figure 1B:
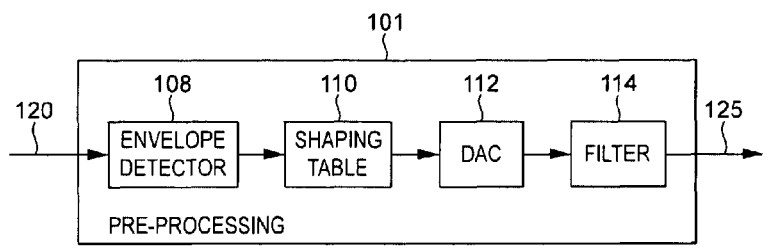

The modulated power supply stage 116 of FIG. 1 is illustrated in FIG. 4, showing the main functional elements thereof. The modulated power supply stage 116 may be implemented in a variety of different ways in accordance with techniques known in the art. As mentioned in the background section above, UK Patent No. 2398648 in the name of Nujira Limited discloses a particularly advantageous modulated power supply stage. As illustrated in FIG. 4, this includes a switched supply comprising a switch driver 404 and a switch 406, which provide a switched supply to a first input of a summer 408. The switch driver 404 and switch 406 represent an exemplary implementation of the coarse path 117 of FIG. 1(a). The switch driver 404 receives the envelope signal on line 125 and in dependence thereon controls the switch 406 (in practice an array of switches) to switch in one of a plurality of supply voltages (not shown).

A tracking amplifier 402 also receives the envelope signal on line 125, and provides an output to a second input of the summer 408. The tracking amplifier 402 represents an exemplary implementation of the correction path 119 of FIG. 1(a). The summer 408 provides the envelope-tracked modulated power supply on line 126. In effect the summer 408 operates to correct the switched supply in dependence upon an error signal provided by the tracking amplifier 402. Although not illustrated in FIG. 4, preferably the tracking amplifier receives as an additional input a signal fed back from the output of the summer 408, to generate a signal representing the error in the output signal. The invention is not limited to the specific implementation of the modulated power supply stage 116 shown in FIG. 4, which is described for exemplary purposes in understanding the invention only, and therefore a detailed explanation of the operation of such a circuit is not presented herein.

In accordance with this embodiment of the invention, the timing alignment and measurement functionality, to determine the timing difference between the supply voltage and the output voltage of the RF amplifier, is provided by a timing alignment and measurement circuit 412. In this embodiment, the timing alignment and measurement circuit 412 is adapted to provide an indication of timing misalignment using the state of voltages and currents within, or generated by, the modulated power supply stage 116.

In the particular example illustrated in FIG. 4, there is also provided a current detector 410, which has a first input receiving a current signal from the tracking amplifier 402 of the modulated power stage 116, and a second input receiving a current signal from the output of the switched supply stage 406 of the modulated power supply stage 116. Thus the current detector 410 receives a current representative of the current drawn in the coarse path 117, and a current representative of the current drawn in the correction path 119.

The current detector 410 provides an output signal on a line 416 to the timing alignment and measurement circuit 412. The timing alignment and measurement circuit 412 additionally receives the envelope signal on line 125 generated by the pre-processing circuitry 101.

The output of the timing alignment and measurement circuit 412 is provided on an output line 414, and comprises timing error information, or mis-alignment information, of the modulated power supply signal and the RF output signal. This timing error information on line 414 is provided as an input to a timing delay stage 401, which is preferably provided at the input to the RF amplifier to apply a delay to the RF input signal on line 122. The timing delay stage 401 thus provides a delayed RF input signal to the RF power amplifier, the delay being appropriate to compensate for any timing misalignment determined by the timing alignment measurement circuit 412. The structure of an adjustable delay stage such as stage 401 will be familiar to one skilled in the art.

The provision of the current detector 410 is illustrative. In the illustrated example, the current detector 410 receives current information from the switched supply output and tracking amplifier output of the modulated power supply stage 116. The current detector 410 then determines, based on these inputs, a current representative of the output current of the modulated power supply stage 116 on line 126, which is the signal delivered on line 416. Alternative arrangements may be provided for providing the current on line 416 representative of the output current to the modulated power supply stage 116, including, for example, sensing the current across a resistor at the output of the modulated power supply stage 116 on line 126.

In accordance with the described embodiment of the invention, the timing alignment and measurement circuit 412 provides the timing misalignment information in dependence upon the current signal on line 416 which represents the output current of the modulated supply stage on line 126, and the envelope signal on line 125. The signal on line 125 represents the timing of the voltage supply signal on line 126, with the unknown delay $T_1$ (see FIG. 1a) applied thereto.

The timing misalignment and measurement block 412 thus measures the timing difference between the signal representing the current at the output of the modulated supply (drawn by the amplifier) and the voltage delivered as the supply voltage to the amplifier. The timing difference represents a misalignment or error, and provision of this difference to the delay block 401 allows for the misalignment to be reduced. The timing alignment and measurement block 412 may provide the delay block 401 with a value of the misalignment and the direction thereof, or may simply provide the direction of the misalignment to allow the delay to be applied in the appropriate direction. If appropriate, a delay block may also be provided at the supply voltage input, to allow for a delay to be applied to the supply voltage if necessary. A controller may be provided to control the application of the delay in dependence upon the output of the timing alignment and measurement block 412.

The current on line 416 is closely related to the magnitude of the RF input signal to be amplified. The envelope signal on line 125 may be a specially shaped function of the envelope signal provided by the envelope detector 108, and therefore the envelope signal on line 125 and the current signal on line 416 may not be closely related. This will in particular be the case where the envelope signal on line 121 is heavily shaped while delivering low power output.

There are described two exemplary implementations for measuring the timing mis-alignment, and consequently for carrying out timing alignment, based on the exemplary embodiment of FIG. 4. These two embodiments are described respectively with reference to FIGS. 5 and 6.

Figure 5:
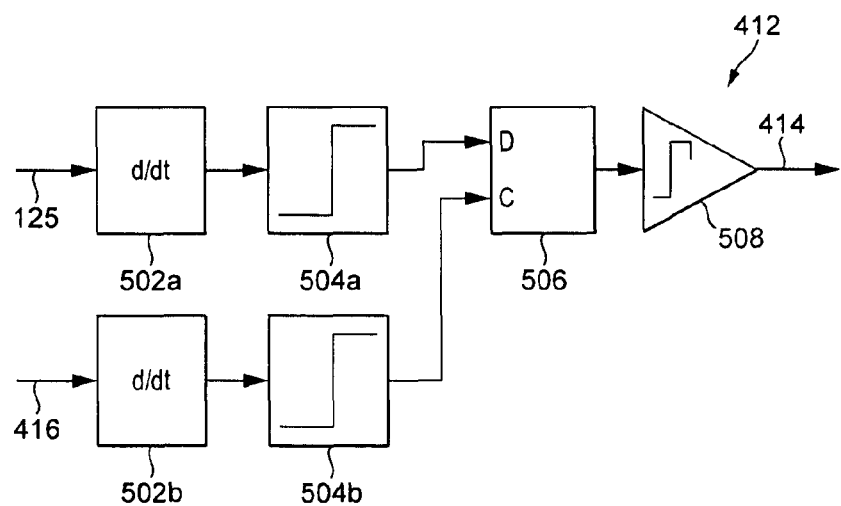
FIG. 5 illustrates an exemplary implementation of the timing alignment measurement functionality of FIG. 4 in a first preferred embodiment.

The implementation of the timing alignment and measurement circuit 412 of FIG. 4 in accordance with a first exemplary implementation is illustrated in FIG. 5. As illustrated in FIG. 5, the exemplary timing alignment and measurement circuit 412 of the first exemplary implementation includes first and second differentiators respectively identified by reference numerals 502a and 502b; first and second comparators respectively identified by reference numerals 504a and 504b; a flip-flop register 506; and an integrator 508.

The first differentiator 502a receives as an input the envelope signal on line 125 at the input to the modulated supply 116. As discussed above, this signal is representative of the timing of the supply voltage delivered to the amplifier on line 126. The output of the differentiator 502a provides the input to the comparator 504a. The output of the comparator 504a forms a first input to the flip-flop 506. The differentiator 502b receives as an input the sensed current on line 416. As discussed above, this signal is representative of the timing of the current drawn by the amplifier from the modulated supply, and therefore the timing of the output voltage of the RF amplifier. The output of the differentiator 502b forms an input to the comparator 504b. The output of the comparator 504b forms a second input to the flip-flop 506. The output of the flip-flop 506 forms an input to the integrator 508. The output of the integrator 508 forms the timing error signal on line 414.

In this first exemplary arrangement as illustrated in FIG. 5, the timing error signal on line 414 provides an indication as to whether the timing alignment lags or leads depending upon whether the detected current on line 416 leads or lags the envelope signal on line 120. The comparators 504a and 504b are zero-crossing comparators, the outputs of which effectively set or reset the register 506. The register output indicates which of the two inputs leads (or lags) the other. The integrator 508 averages the output of the register 506. The inputs to the register 506 may be swapped, and are not limited to the arrangement shown.

This first embodiment thus provides an arrangement in which the timing error information on line 414 gives an indication of the direction of the error, but not information as to the magnitude of the error. This timing error information can be used to control the direction of the delay applied in the delay stage 104, but not the magnitude of the delay. However alignment can still be achieved by way of successive approximation.

It should be noted that in the arrangement of FIG. 5, where the voltage at the input to the modulated supply is used, an appropriate compensation may be needed to compensate for the known delay $T_3$ introduced by the modulated supply itself.

Figure 6:
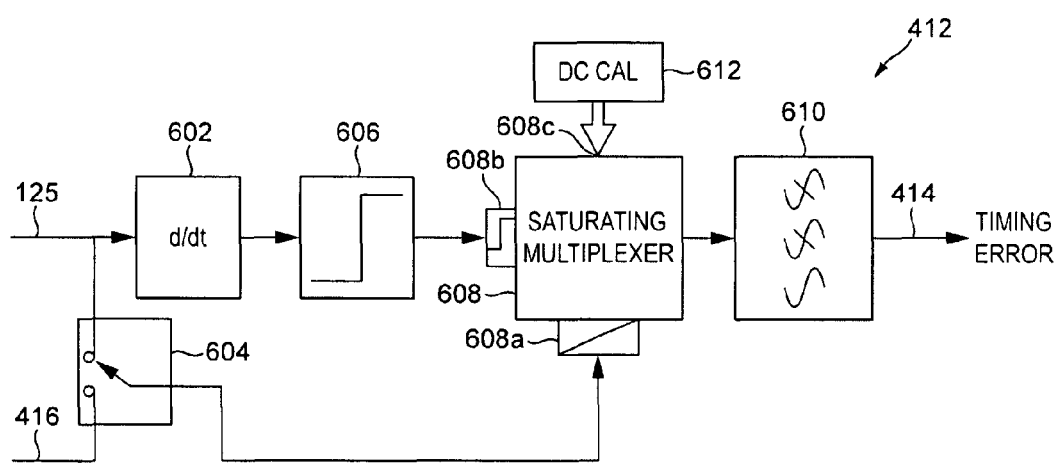
FIG. 6 illustrates an exemplary implementation of the timing alignment measurement functionality of FIG. 4 in a second preferred embodiment.

A second exemplary implementation in accordance with the embodiment of FIG. 4 is described with reference to FIG. 6. As illustrated in FIG. 6, in the second exemplary embodiment the timing alignment and measurement circuit 412 includes a differentiator 602, a switch 604, a comparator 606, a saturating multiplier 608, a calibration block 612 and a filter 610.

The timing alignment and measurement circuit 412 of FIG. 6 is arranged to obtain the differential of one of the signals, i.e. one of the detected current on line 416 and the envelope signal on line 125, in order to obtain a timing error signal on line 414 which includes both magnitude and sign (direction) information.

The envelope signal on line 125 is provided as an input to the differentiator 602 for differentiation. The differentiated signal provided by the differentiator 602 forms an input to the comparator 606, which extracts a sign of the differentiated signal. Thus the output of the comparator 606 is sign information. The sign information at the output of the comparator 606 is provided to a switching port 608b of the saturating multiplier 608, which is a single linear input multiplier.

The detected current on line 416 is provided as a first input to a switch block 604, which receives as a second input the envelope signal on line 120. The switch 604 is controlled to apply either the detected current on line 416 or the envelope signal on line 120 to a linear input 608a of the saturating multiplier 608.

The switch 604 is controlled such that during a calibration stage the envelope signal on line 120 is delivered to the input 608a of the saturating multiplier. The multiplier 608 then receives inputs based on the envelope signal at both inputs 608b and 608a. The resulting output of the multiplier is a dc offset value which is stored in the calibration block 612.

The calibration block 612 thus provides a calibration input at input 608c of the saturating multiplier. This calibration input provides a dc offset value to be removed from the output of the multiplier.

The switch 604 is further controlled in a measurement phase such that the current signal on line 416 is provided to the input 608a of the saturating multiplier 608.

In the measurement phase the multiplier 608 receives at inputs 608b and 608a signals based on the envelope signal and the measured current, multiplies these signals, and removes the dc offset from the multiplied result.

The output of the saturating multiplier 608 is provided to the low pass filter 610 to provide the timing error signal on line 414. This timing error signal provides the magnitude and direction of the timing misalignment.

The theory supporting the operation of the second embodiment as illustrated in FIG. 6 can be understood as follows. It should be noted that in the following analysis the two signals are interchangeable. In general there is performed an analysis in dependence on (i) the envelope signal, being the voltage at the input or output of the modulated supply, and (ii) in dependence on the current drawn from the modulated supply. Thus there are two signals to be measured in the measurement system.

For the purposes of the following analysis, it is assumed that the first signal of the two signals in the measurement system is the envelope signal. The envelope signal, en, on line 125 can be represented as a series of sinewaves:

$$en = \sum_{x=1}^{n} \sin(nx) \qquad \text{Equation 1}$$

Differentiating this representation provides a representation of the differentiation of the envelope signal in the measurement system, at the output of the differentiator 602, as follows:

$$en = \sum_{x=1}^{n} n\cos(nx) \qquad \text{Equation 2}$$

In the idealised case, the waveforms of the envelope signal and the current signal are identical, as the information contained in each is, in the ideal case, the same.

On multiplying the envelope signal, (representing the other signal in the measurement system, the current, in the idealised case) assumed to be the signal on line 416 with its own differential, there is provided the output of the multiplier 608, which can be denoted as Eout:

$$E_{out} = en * en'$$

If for simplicity the sinewave is represented as sin x, with a fixed timing offset represented by alpha (representing the timing error between the input signals of the measurement system of FIG. 6), then this provides:

$$E_{out} = \sin x \cos(x+a) \qquad \text{Equation 3}$$

Where alpha is the timing offset of the signal. The timing offset is considered as present in only one of the two signals.

What is important is the relative offset of the two signals, rather than an offset of each relative to a timing mark.

Expanding Equation 3 provides:

$$Eout = \frac{\sin 2x}{2}\cos\alpha + \left(\frac{1}{2} + \frac{\cos 2x}{2}\right)\sin\alpha \qquad \text{Equation 4}$$

On filtering the output of the multiplier 608, Eout, by the low-pass filter 610, the high frequency products are reduced, and Equation 4 is simplified to:
Eout=

$$Eout = \left(\frac{1}{2}\right)\sin\alpha \qquad \text{Equation 5}$$

If the input signals to the measurement system are assumed to be the same but mis-aligned, as is the situation in the idealised case, then the x terms in the sine and cosine expressions are equal. This applies to all components of the signal, resulting in a DC term at the output of the filter 610 that can be used to steer timing alignment and remove misalignment. If the x terms in the sine and cosine terms were not equal, then no DC term would be generated. Thus the theory of this described arrangement relies upon the x terms being equal: this requires one signal to be a (delayed) replica of the other.

However, a single sine wave (the case where n=1) is not very useful for communication systems, although useful for a basic understanding of the theory. Typical communications systems have a set of complex baseband signals that are modulated onto an RF carrier, such as illustrated by block 102 in FIG. 1. These baseband components are bandlimited and can therefore be considered as a continuum of sinewaves. When carrying out time domain multiplication of, for example, two such functions (denoted f1 and f2), each and every discrete sinewave term in one product f1 must be cross multiplied with each and every term in the other product f2. This means that the w1*a* term of f1 must be multiplied with the [w1*b* w2*b* . . . wn*b*] terms of f2, etc., where the functions f1 and f2 can be represented as:

f1=sin w1*at*+sin w2*at*+sin w3*at*+ . . . sin w*nat* f2=sin w1*bt*+sin w2*bt*+sin w3*bt*+ . . . sin w*nbt*

However, if the f2 signal is derived by some mathematical operation from the f1 signal, the two signals are closely associated in time. If w2 and w3 are not harmonically related to w1, then products w*nbt* can be considered for the purposes of this operation not to coexist at any instant in time. Therefore, it is not necessary to consider cross-products that do not contain wx or harmonics of wx. This assumption is valid provided there is no long term memory associated with the mathematical operation, and then the cross products between different sinewave terms can be assumed to be zero. If any terms are not zero, the fact that the frequency terms are not equal means that there is no DC component. When differentiating a signal, there is no long term memory associated with that operation, but any harmonics of the original signal are accentuated. Therefore it is valid to consider the baseband signal as a sinewave.

In a typical baseband signal frequency can vary between cycles, creating a signal that occupies a continuous band rather than one discrete tone. However, the invention is not concerned with the original baseband signal, it is concerned with the absolute value of the original signal.

An absolute function may be used to generate the envelope in the envelope detector 108 of FIG. 1. If the bandlimited original signal is considered to be a sinewave, then an envelope signal can be obtained by Fourier expansion of the absolute value of a sine wave. In this case the envelope signal, analogous to the representation of Equation 1, can be represented in the frequency domain as:

$F1=|\sin(nwt)|=$ $$0.8 - \sqrt{2}\left(\left(\frac{1}{3}\right)\cos(2\omega t) + \left(\frac{1}{15}\right)\cos(4\omega t) + \left(\frac{1}{35}\right)\cos(6\omega t) + \ldots\right) \qquad \text{Equation 6}$$

The remainder of the terms can be considered insignificant. This function has a close resemblance to the shaped envelope function: shaping is intended to maintain this relationship, without following the envelope signal into big troughs.

Differentiating Equation 6 provides a representation, analogous to the representation of Equation 2 (and in the idealised case) of the signal to be amplified:

$F1'=$ $$\omega\sqrt{2}\left(\left(\frac{2}{3}\right)\sin(2\omega t) + \left(\frac{4}{15}\right)\sin(4\omega t) + \left(\frac{6}{35}\right)\sin(6\omega t) + \ldots\right) \qquad \text{Equation 7}$$

Allowing for timing alignment, the envelope signal of Equation 6 can be re-written as:

$F1=|\sin(n\omega(t+\tau))|$ $$0.8 - \sqrt{2}\left(\left(\frac{1}{3}\right)\cos(2\omega(t+\tau)) + \left(\frac{1}{15}\right)\cos(4\omega(t+\tau)) + \left(\frac{1}{35}\right)\cos(6\omega(t+\tau)) + \ldots\right) \qquad \text{Equation 8}$$

When multiplying the signals of Equations 7 and 8 together in the multiplier 608, the cross product terms, (cos 2w*sin 4w), do not produce low frequency solutions (and would therefore be removed by the filter 610). Therefore tones of the same frequency need only be considered. Tones of different frequencies would mean that the two signals do not represent the same information (different frequency terms do not give cross-products) and would not represent the same signals with a relative time offset.

In Equation 3 above, sin x is replaced with a sin series representing absolute value of sin(nwt) and cos(α) with a differentiated series of abs(sin(nw(t+τ)))), and the low frequency component of the multiplier operation provides:

$$w\left(\left(\frac{2}{9}\right)\sin(2\omega\tau) + \left(\frac{4}{225}\right)\sin(4\omega(\tau)) + \left(\frac{6}{1225}\right)\sin(6\omega(\tau)) + \ldots\right) \qquad \text{Equation 9}$$

The DC terms decrease rapidly as a function of harmonic order. This means that the fundamental component is dominant.

However in practice there are two potential problems with the second embodiment described with reference to FIG. 6. Firstly, the generation of derivative terms means the circuit is more susceptible to HF noise. Secondly, analogue multipliers are difficult to implement.

Since only one signal needs to be differentiated, a signal that is present in a low noise environment is preferably chosen. The current and voltage on the output of the modulator are both present in a high frequency noise environment (the RF). Therefore instead of using the output terminal (i.e. output of RF amplifier 106), the input terminal of the tracking amplifier (i.e. the input of the modulated supply) is preferably used. As the function of the tracking amplifier of the modulated supply is to make the output equal to this internal envelope signal, this internal signal can be used as a reference. On an integrated circuit the signal can be made differential so it can have inherent rejection of unwanted noise. The fact that this is a low noise signal means that not only can it be differentiated; it can also be made into a sign only signal. If the shaping function is monotonic, the derivative of the shaped function will be of the same sign as the unshaped function. This means that one of the input ports of the multiplier can be a switched port rather than a linear port, resulting in a much simplified multiplier design.

For the embodiments of FIG. 6, the shape as can be predicted from equation 9 is a sine function. The level of output changes depending upon the envelope level, but the zero crossing point is constant.

The present invention has been described herein by way of reference to particular preferred embodiments. However the invention is not limited to such embodiments. The present invention is a particular application in relation to RF amplifiers, but is not limited to such implementations. The invention can be advantageously utilised in any environment where a modulated supply signal should be preferably aligned with another signal.

The described preferred embodiments utilising an RF amplifier are not limited to any particular load being driven by such RF amplifier. However it is envisaged that such an RF amplifier will typically drive an antenna. As such the present invention has particularly advantageous uses in the field of communications, including the field of mobile communications, and particularly in mobile handsets.

What is claimed is:

1. A method, in an amplifier stage comprising an amplifier and a modulated supply, the amplifier being arranged to amplify an input signal and the modulated supply being arranged to generate a supply voltage for the amplifier by tracking an envelope of the signal to be amplified, the method comprising:
   comparing the relative timing of a signal representing the current drawn by the amplifier from the modulated supply and a signal representing the voltage generated at the output of the modulated supply; and
   in dependence upon a difference in the relative timing, adjusting the timing of either the input signal to be amplified or the generated supply voltage to reduce the difference in the relative timing.

2. The method according to claim 1, further comprising the step of deriving the signal representing the current drawn by the amplifier from the modulated supply stage from the current signal at the output of the modulated supply.

3. The method according to claim 1, wherein the modulated supply comprises a coarse path for generating a coarse representation of the supply voltage and a correction path for generating a correction voltage to be applied to the coarse representation for generation of the supply voltage, the method further comprising the step of deriving the signal representing the current drawn by the amplifier from the current signal in the coarse path and current signal in the correction path, and combining such current signals.

4. The method according to claim 1 further comprising the step of deriving the signal representing the voltage at the output of the modulated supply stage from the voltage at the output of the modulated supply.

5. The method according to claim 1 further comprising the step of deriving the signal representing the voltage at the output of the modulated supply stage from the voltage at the input of the modulated supply.

6. The method of claim 5 wherein the step of comparing the relative timing difference further includes the step of adjusting the timing of the signal representing the voltage at the input of the modulated supply to compensate for timing delays with the modulated supply.

7. The method of claim 1 wherein the step of adjusting the timing comprises applying a delay in the RF input path to the amplifier.

8. The method of claim 1 wherein the step of adjusting the timing comprises applying a delay in the RF supply path to the amplifier.

9. The method of claim 1 further comprising:
   differentiating the signal representing the voltage at the output of the modulated supply;
   differentiating the signal representing the current drawn by the amplifier;
   zero-crossing comparing the differentiated signal representing the voltage at the output of the modulated supply;
   zero-crossing comparing the differentiated signal representing the current drawn by the amplifier;
   setting or resetting a register in dependence on the outputs of the zero-crossing steps, such that the register output indicates which of the two signals leads or lags the other; and
   integrating the register output of the register to average the output of the register, and providing at an output a signal indicative of direction of a misalignment between the voltage at the output of the modulated supply and the current drawn by the modulated supply.

10. The method of claim 1 further comprising:
    differentiating one of the signal representing the current drawn by the modulated supply or the signal representing the output voltage;
    comparing the differentiated signal to extract a sign of the differentiated signal;
    providing, at a switching port of a saturating single linear input multiplier, the sign of the differentiated signal;
    selectively connecting either the signal representing the current drawn by the modulated supply or the signal representing the output voltage to a linear input of the multiplier;
    controlling the switch such that: in a calibration phase the one of the signal representing the current drawn by the modulated supply or the signal representing the output voltage connected to the differentiator is connected to the linear input, to provide a dc offset value for a calibration block of the multiplier; and in a measurement phase the one of the signal representing the current drawn by the modulated supply or the signal representing the output voltage not connected to the differentiator is connected to the linear input, further wherein in the measurement stage the multiplier multiplies the sign from the output of the comparator with the signal at the linear input, and removes the dc offset; and
    low pass filtering the output of the multiplier and for generating a signal indicative of the magnitude and direction of a misalignment between the voltage at the output of the modulated supply and the current drawn by the modulated supply.

11. An amplifier stage comprising an amplifier and a modulated supply, the amplifier being arranged to amplify an input signal and the modulated supply being arranged to generate a supply voltage for the amplifier by tracking an envelope of the input signal, the amplifier stage further comprising:
 a comparator for comparing the relative timing of a signal representing the current drawn by the amplifier from the modulated supply and a signal representing the voltage generated at the output of the modulated supply; and
 a delay stage, operable in dependence upon a difference in the relative timing, for adjusting the timing of either the input signal to be amplified or the generated supply voltage, to reduce the difference in the relative timing.

12. The amplifier stage according to claim 11, wherein the signal representing the current drawn by the amplifier from the modulated supply stage is derived from the current signal at the output of the modulated supply.

13. The amplifier stage according to claim 11, wherein the modulated supply comprises a coarse path for generating a coarse representation of the supply voltage and a correction path for generating a correction voltage to be applied to the coarse representation for generation of the supply voltage, wherein the signal representing the current drawn by the amplifier is derived from the current signal in the coarse path and the current signal in the correction path, and the amplifier stage includes combiner to combine such current signals.

14. The amplifier stage according to claim 11 further wherein the signal representing the voltage at the output of the modulated supply stage is derived from the voltage at the output of the modulated supply.

15. The amplifier stage according to claim 11 further wherein the signal representing the voltage at the output of the modulated supply stage is derived from the voltage at the input of the modulated supply.

16. The amplifier stage of claim 15 further including an adjustment means for adjusting the timing of the signal representing the voltage at the input of the modulated supply to compensate for timing delays with the modulated supply.

17. The amplifier stage of claim 11 further including a delay stage in the RF input path to the amplifier for adjusting the timing.

18. The amplifier stage of claim 11 further including a delay stage in the RF supply path to the amplifier for adjusting the timing.

19. The amplifier stage of claim 11 further comprising:
 a first differentiator for receiving as an input the signal representing the voltage at the output of the modulated supply and for generating a differentiated version thereof as an output;
 a second differentiator for receiving as an input the signal representing the current drawn by the amplifier and for generating a differentiated version thereof as an output;
 a first zero-crossing comparator for receiving as an input the output of the first differentiator and for generating an output;
 a second zero-crossing comparator for receiving as an input the output of the second differentiator and for generating an output;
 a register for receiving as first and second inputs the outputs of the first and second comparators, wherein the first and second comparators set or reset an output of the register, such that the register output indicated which if the two inputs leads or lags the other; and
 an integrator for receiving as an input the output of the register and for averaging the output of the register, to provide at an output thereof a signal indicative of direction of a misalignment between the voltage at the output of the modulated supply and the current drawn by the modulated supply.

20. The amplifier stage of claim 11 further comprising:
a differentiator for receiving as an input one of the signal representing the current drawn by the modulated supply or the signal representing the output voltage, and for generating a differentiated version thereof as an output;
a comparator for receiving the output of the differentiator, for extracting a sign of the differentiated signal;
a saturating single linear input multiplier for receiving at a switching port thereof the sign at the output of the comparator;
a switch for selectively connecting either the signal representing the current drawn by the modulated supply or the signal representing the output voltage to a linear input of the multiplier;
a controller for controlling the switch such that: in a calibration phase the one of the signal representing the current drawn by the modulated supply or the signal representing the output voltage connected to the differentiator is connected to the linear input, to provide a dc offset value for a calibration block of the multiplier; and in a measurement phase the one of the signal representing the current drawn by the modulated supply or the signal representing the output voltage not connected to the differentiator is connected to the linear input, further wherein in the measurement stage the multiplier multiplies the sign from the output of the comparator with the signal at the linear input, and removes the dc offset; and
a low pass filter for receiving the output of the multiplier and for generating a signal indicative of the magnitude and direction of a misalignment between the voltage at the output of the modulated supply and the current drawn by the modulated supply.

* * * * *